United States Patent
Prasad

(10) Patent No.: US 6,198,732 B1
(45) Date of Patent: Mar. 6, 2001

(54) FORWARD-LINK TRAFFIC/PAGING-CHANNEL INTERLEAVING FOR COMMUNICATION SYSTEMS BASED ON CLOSED-FORM EXPRESSIONS

(75) Inventor: Mohit K. Prasad, San Diego, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/039,158

(22) Filed: Mar. 13, 1998

(51) Int. Cl.⁷ ........................................ H04J 13/00
(52) U.S. Cl. .................. 370/335; 370/320; 370/441; 370/501; 370/342
(58) Field of Search .................. 370/335, 441, 370/332, 442, 295, 331, 203, 320, 209, 330, 311, 480, 204, 355, 342, 341, 350, 501; 455/428, 449, 447, 456, 522, 422; 714/2; 375/130, 134, 137

(56) References Cited

U.S. PATENT DOCUMENTS

| | | | |
|---|---|---|---|
| 4,199,660 | * 4/1980 | Dill et al. ............................... | 370/50 |
| 4,742,517 | * 5/1988 | Takagi et al. ........................... | 371/2 |
| 5,418,813 | 5/1995 | Schaffner et al. .................... | 375/205 |
| 5,673,291 | 9/1997 | Dent .................................... | 375/262 |
| 5,675,344 | 10/1997 | Tong et al. ........................... | 342/457 |
| 5,812,543 | 9/1998 | Sugita .................................. | 370/335 |
| 5,946,356 | 8/1999 | Felix et al. ........................... | 375/295 |
| 5,949,796 | 9/1999 | Kumar ................................. | 370/529 |
| 6,005,855 | 12/1999 | Zehavi et al. ........................ | 370/335 |
| 6,064,664 | * 5/2000 | Kim ..................................... | 370/335 |

OTHER PUBLICATIONS

"Realization of Optimum Interleavers", by John Ramsey, IEEE Transactions on Information Theory, vol.IT–16, No. 3, May 1970, pp. 337–345.

* cited by examiner

Primary Examiner—Dang Ton
Assistant Examiner—Anthony Ton
(74) Attorney, Agent, or Firm—Steve Mendelsohn

(57) ABSTRACT

Interleaving of forward-link paging or traffic channels is performed by implementing closed-form expressions that are equivalent to the table-based processing specified in the cdmaOne telecommunication specification. The implementation can be in either hardware or software or a combination of both. For each cdmaOne forward-link paging or traffic channel, the closed-form expression relates each un-interleaved symbol position to a corresponding interleaved symbol position, which is used to generate an interleaved symbol stream from the un-interleaved symbol stream. In one hardware implementation, the forward-link interleaver of the present invention has an address generation unit made from a modulo counter, a multiplier, and an adder.

21 Claims, 4 Drawing Sheets

FIG. 1A

| | | | | | | | | | | | | | | | |
|---|---|---|---|---|---|---|---|---|---|---|---|---|---|---|---|
| 1 | 25 | 49 | 73 | 97 | 121 | 145 | 169 | 193 | 217 | 241 | 265 | 289 | 313 | 337 | 361 |
| 2 | 26 | 50 | 74 | 98 | 122 | 146 | 170 | 194 | 218 | 242 | 266 | 290 | 314 | 338 | 362 |
| 3 | 27 | 51 | 75 | 99 | 123 | 147 | 171 | 195 | 219 | 243 | 267 | 291 | 315 | 339 | 363 |
| 4 | 28 | 52 | 76 | 100 | 124 | 148 | 172 | 196 | 220 | 244 | 268 | 292 | 316 | 340 | 364 |
| 5 | 29 | 53 | 77 | 101 | 125 | 149 | 173 | 197 | 221 | 245 | 269 | 293 | 317 | 341 | 365 |
| 6 | 30 | 54 | 78 | 102 | 126 | 150 | 174 | 198 | 222 | 246 | 270 | 294 | 318 | 342 | 366 |
| 7 | 31 | 55 | 79 | 103 | 127 | 151 | 175 | 199 | 223 | 247 | 271 | 295 | 319 | 343 | 367 |
| 8 | 32 | 56 | 80 | 104 | 128 | 152 | 176 | 200 | 224 | 248 | 272 | 296 | 320 | 344 | 368 |
| 9 | 33 | 57 | 81 | 105 | 129 | 153 | 177 | 201 | 225 | 249 | 273 | 297 | 321 | 345 | 369 |
| 10 | 34 | 58 | 82 | 106 | 130 | 154 | 178 | 202 | 226 | 250 | 274 | 298 | 322 | 346 | 370 |
| 11 | 35 | 59 | 83 | 107 | 131 | 155 | 179 | 203 | 227 | 251 | 275 | 299 | 323 | 347 | 371 |
| 12 | 36 | 60 | 84 | 108 | 132 | 156 | 180 | 204 | 228 | 252 | 276 | 300 | 324 | 348 | 372 |
| 13 | 37 | 61 | 85 | 109 | 133 | 157 | 181 | 205 | 229 | 253 | 277 | 301 | 325 | 349 | 373 |
| 14 | 38 | 62 | 86 | 110 | 134 | 158 | 182 | 206 | 230 | 254 | 278 | 302 | 326 | 350 | 374 |
| 15 | 39 | 63 | 87 | 111 | 135 | 159 | 183 | 207 | 231 | 255 | 279 | 303 | 327 | 351 | 375 |
| 16 | 40 | 64 | 88 | 112 | 136 | 160 | 184 | 208 | 232 | 256 | 280 | 304 | 328 | 352 | 376 |
| 17 | 41 | 65 | 89 | 113 | 137 | 161 | 185 | 209 | 233 | 257 | 281 | 305 | 329 | 353 | 377 |
| 18 | 42 | 66 | 90 | 114 | 138 | 162 | 186 | 210 | 234 | 258 | 282 | 306 | 330 | 354 | 378 |
| 19 | 43 | 67 | 91 | 115 | 139 | 163 | 187 | 211 | 235 | 259 | 283 | 307 | 331 | 355 | 379 |
| 20 | 44 | 68 | 92 | 116 | 140 | 164 | 188 | 212 | 236 | 260 | 284 | 308 | 332 | 356 | 380 |
| 21 | 45 | 69 | 93 | 117 | 141 | 165 | 189 | 213 | 237 | 261 | 285 | 309 | 333 | 357 | 381 |
| 22 | 46 | 70 | 94 | 118 | 142 | 166 | 190 | 214 | 238 | 262 | 286 | 310 | 334 | 358 | 382 |
| 23 | 47 | 71 | 95 | 119 | 143 | 167 | 191 | 215 | 239 | 263 | 287 | 311 | 335 | 359 | 383 |
| 24 | 48 | 72 | 96 | 120 | 144 | 168 | 192 | 216 | 240 | 264 | 288 | 312 | 336 | 360 | 384 |

FORWARD-LINK TRAFFIC/PAGING-CHANNEL INTERLEAVING FOR COMMUNICATION SYSTEMS BASED ON CLOSED-FORM EXPRESSIONS

CROSS-REFERENCES TO RELATED APPLICATIONS

This application is one of the following five U.S. patent applications filed on the same date: Ser. Nos. 09/039,151, 09/092,397, 09/039,157, 09/039,158, and 09/039,154 the teachings of all of which are incorporated herein by reference.

BACKGROUND OF THE INVENTION

1. Field of the Invention

The present invention relates to telecommunication systems conforming to the cdmaOne standard.

2. Description of the Related Art

The cdmaOne™ communication standard is an interim standard for mobile telecommunication systems in which communications to and from each mobile unit are supported by one of a set of base stations strategically located over the system coverage area. The cdmaOne standard specifies a common air interface for code division multiple access (CDMA) systems on the cellular (900 MHz) and the PCS (1900 MHz) bands for mobile telephony. In addition, the same air interface is used for different wireless loop equipment supplied by a significant number of manufacturers. The term "cdmaOne" is used to refer collectively to the IS-95, IS-95A, and IS-95B family of communication standards.

The cdmaOne standard specifies that the symbols encoded in both the forward-link signal transmitted from the base station to the mobile unit and the reverse-link signal transmitted from the mobile unit to the base station be interleaved in the signal stream. Interleaving is performed to make burst errors during transmission look like random errors that are separated from one another in the de-interleaved symbol stream. In that case, the decoder in a receiver can perform error correction to reconstruct the original symbol stream notwithstanding the presence of burst errors.

According to the cdmaOne standard, a base station transmits forward-link data on a Pilot channel (used for timing acquisition), a Sync channel (used for synchronization) at 4800 bps, Paging channels at either 9600 or 4800 bps, and four Traffic (or Fundamental) channels at 9600, 4800, 2400, and 1200 bps. Each frame in a forward-link Paging or Traffic channel contains 384 symbols. At 9600 bps, each symbol occurs once per frame. At 4800 bps, each symbol occurs two times in a row; four times at 2400 bps; and eight times at 1200 bps. The data rates of 9600, 4800, 2400, and 1200 bps correspond to the set of four unpunctured rates under the cdmaOne standard referred to as Rate Set 1.

The cdmaOne standard also supports a second set of data rates referred to as Rate Set 2. In Rate Set 2, punctured convolutional codes are used to transmit data at 14400, 7200, 3600, and 1800 bps, corresponding to the unpunctured rates of 9600, 4800, 2400, and 1200 bps, respectively. By using punctured convolutional codes, the number of symbols per frame is maintained, and the interleaving structure for the four rates of Rate Set 2 is the same as the interleaving structure for the four rates of Rate Set 1.

Since only null data is sent on the Pilot channel, no interleaving is used on this channel. However, the cdmaOne specification does require interleaving for the rest of the forward-link channels.

For example, the cdmaOne standard specifies the forward-link interleaving process at the base station for the Paging and Traffic channels by means of a table. FIG. 1A shows the order in which the 384 symbols of each frame of un-interleaved forward-link Paging/Traffic data may be sequentially (or linearly) arranged within a matrix of 24 rows and 16 columns in the base station. The symbols are written columnwise, beginning with the first column on the left, successively from the top row to the bottom row.

Figure 1B:
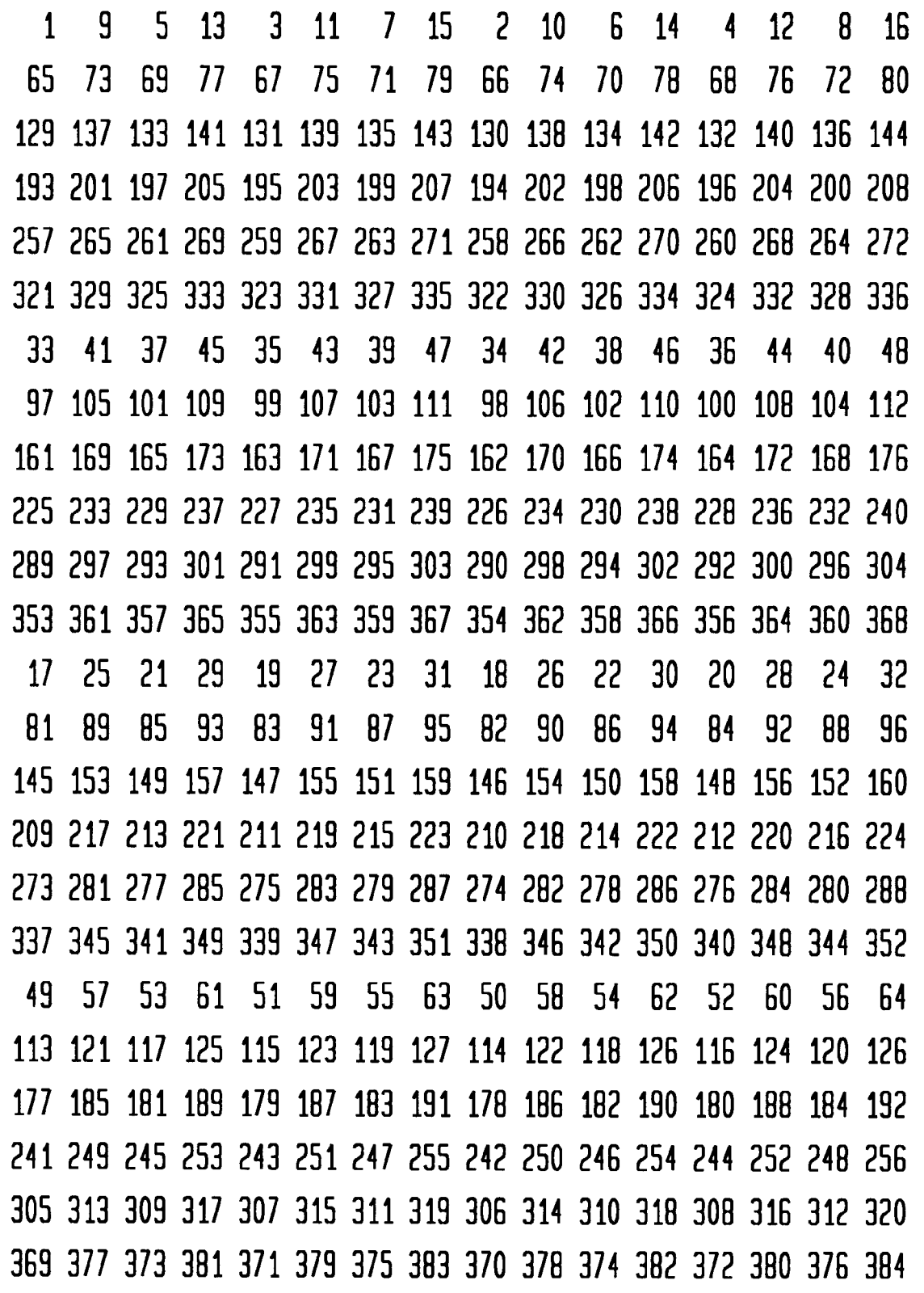

FIG. 1B shows the order in which the 384 symbols stored in the matrix of FIG. 1A are to be read in order to form a frame of interleaved forward-link Paging/Traffic data for the 9600-bps data rate. The sequence of symbols in FIG. 1B are listed columnwise, beginning with the first column on the left, successively from the top row to the bottom row. Thus, the symbol in position #1 in FIG. 1A is the first symbol in an interleaved frame, followed by the symbol in position #65, followed by the symbol in position #129, etc.

The interleaving scheme for the three other data rates (i.e., 4800, 2400, and 1200 bps) is identical to that shown in FIG. 1B for the 9600-bps data rate. The only difference is that, for the 4800-bps data rate, for example, the symbols stored in positions #1 and #2 in FIG. 1A correspond to the two occurrences of the first symbol in the frame, positions #3 and #4 correspond to the two occurrences of the second symbol in the frame, etc. Similarly, for the 2400-bps data rate, each set of four consecutive positions in FIG. 1A correspond to a different symbol in the frame, and, for the 1200-bps data rate, each set of eight consecutive positions in FIG. 1A correspond to a different symbol in the frame. The interleaving scheme for the different data rates in Rate Set 2 is identical to that for the corresponding data rates in Rate Set 1.

The cdmaOne standard specifies that the forward-link interleaving process be implemented using a table-based procedure that can be implemented at a reasonable cost only in software.

SUMMARY OF THE INVENTION

The present invention is directed to an interleaving process for cdmaOne base stations in which the forward-link un-interleaved symbol stream is interleaved by hardware and/or software that implements closed-form expressions corresponding to the table-based procedures specified in the cdmaOne standard.

According to one embodiment, a closed-form expression relating each un-interleaved symbol position in a un-interleaved symbol stream to a corresponding interleaved symbol position is used to generate an interleaved symbol position for each symbol in the un-interleaved symbol stream. An interleaved symbol stream is generated from the un-interleaved symbol stream using the interleaved symbol positions.

In one hardware implementation, the present invention is an integrated circuit having an interleaver for interleaving a forward-link channel of a cdmaOne communication system. The interleaver comprises a symbol buffer and an address generation unit. The address generation unit is adapted to generate symbol addresses for reading un-interleaved symbols from or writing interleaved symbols to the symbol buffer. For each un-interleaved channel, the address generation unit implements a closed-form expression relating each un-interleaved symbol position to a corresponding interleaved symbol position to generate an interleaved symbol position for each symbol in the un-interleaved symbol stream.

BRIEF DESCRIPTION OF THE DRAWINGS

Other aspects, features, and advantages of the present invention will become more fully apparent from the following detailed description, the appended claims, and the accompanying drawings in which:

FIG. 1A shows the order in which the 384 symbols of each frame of un-interleaved forward-link Paging/Traffic data are arranged in a matrix of 24 rows and 16 columns during the interleaving operation in a cdmaOne base station;

FIG. 1B shows the order in which the 384 symbols stored in the matrix of FIG. 1A are to be read in order to form a frame of interleaved forward-link Paging/Traffic data;

DETAILED DESCRIPTION

Figure 2:
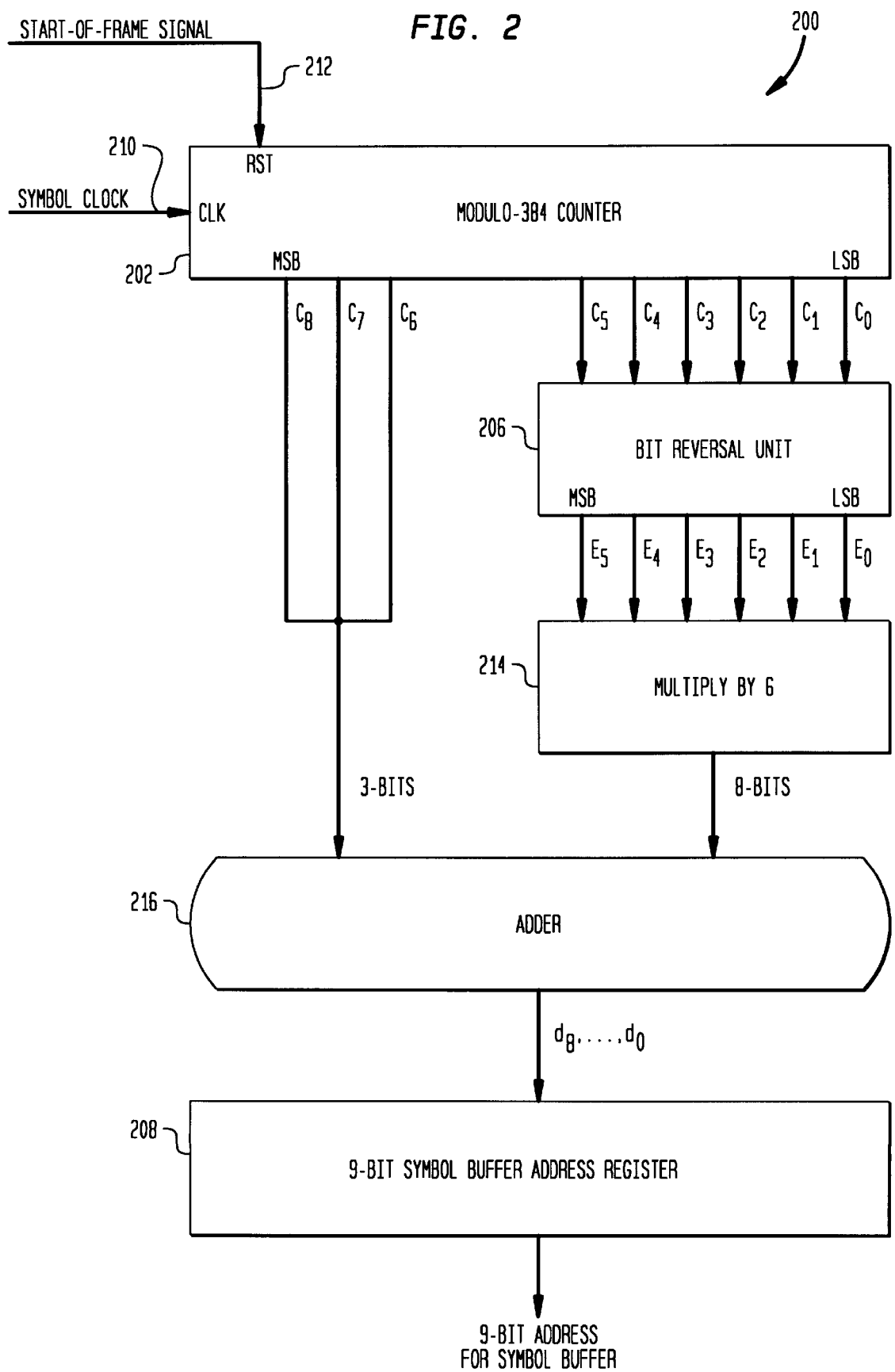
FIG. 2 shows a block diagram of an address generation unit for a cdmaOne forward-link interleaver, according to one possible hardware embodiment of the present invention.

According to the present invention, the interleaving process applied to the forward-link stream of un-interleaved Paging/Traffic symbols by a base station in a cdmaOne telecommunication system corresponds to the implementation of closed-form expressions, rather than the table-based procedure of conventional cdmaOne systems. Depending on the particular embodiment, the closed-form expressions can be implemented in either hardware or software.

Closed-Form Expressions

This section presents closed-form expressions that relate the symbol positions in the un-interleaved stream to the symbol positions in the interleaved stream for the forward-link Paging and Traffic channels transmitted from the base stations to the mobile units of a cdmaOne telecommunication system. If $N_{IN}$ represents the symbol position in the un-interleaved stream and $N_{OUT}$ represents the symbol position in the interleaved stream, then a closed-form expression may be presented as follows:

$$N_{OUT}=F(N_{IN})$$

where F( ) represents the operations applied to the un-interleaved symbol position $N_{IN}$ to generate the interleaved symbol position $N_{OUT}$. The interleaved symbol position $N_{OUT}$ can be thought of as the buffer address for the interleaved symbol stream, where the buffer corresponds to the matrix shown in FIG. 1B.

For each frame, the symbols in the un-interleaved signal stream are counted sequentially from $N_{IN}$ equals 0 to 383. (Note that FIG. 1A shows the sequence of symbols running from 1 to 384, because this is how the interleaving patterns are specified in the cdmaOne standard.) The un-interleaved symbol position $N_{IN}$ can be represented by the 9-tuple ($c_8$, $c_7$, $c_6$, $c_5$, $c_4$, $c_3$, $c_2$, $c_1$, c0), where the $c_i$'s are binary values, $c_8$ is the most significant bit (MSB) of $N_{IN}$, and $c_0$ is the least significant bit (LSB) of $N_{IN}$. As such, $N_{IN}$ can be represented by the 9-tuple ($c_8$, $c_7$, $c_6$, $c_5$, $c_4$, $c_3$, $c_2$, $c_1$, $C_0$), according to Equation (1) as follows:

$$N_{IN}=2^8 c_8+2^7 c_7+2^6 c_6+2^5 c_5+2^4 c_4+2^3 c_3+2^2 c_2+2c_1+c_0. \quad (1)$$

For the Paging and Traffic channels, the interleaved symbol position $N_{OUT}$ is given by Equation (2) as follows:

$$N_{OUT}6\times(2^5 c_0+2^4 c_1+2^3 c_2+2^2 c_3+2c_4+c_5)+2^2 c_8+2c_7+c_6$$
$$=2^8 d_8+2^7 d_7+2^6 d_6+2^5 d_5+2^4 d_4+2^3 d_3 30\ 2^2 d_2+2d_1+d_0 \quad (2)$$

where $N_{OUT}$ is represented by the 9-tuple ($d_8$, $d_7$, $d_6$, $d_5$, $d_4$, $d_3$, $d_2$, $d_1$, $d_0$).

Equation (2) can be rewritten by bringing a factor of 2 inside the parentheses to yield Equation (2A) as follows:

$$N_{OUT}=3\times(2^6 c_0+2^5 c_1+2^4 c_2+2^3 c_3+2^2 c_4+2c_5)+2^2 c_8+2c_7+c_6 \quad (2A)$$

Since 3=(2+1), Equation (2A) can be rewritten to yield Equation (2B) as follows:

$$N_{OUT}=2\times(2^6 c_0+2^5 c_1+2^4 c_2+2^3 c_3+2^2 c_4+2c_5)+2^6 c_0+2^5 c_1+2^4 c_2+2^3 c_3+2^2 c_4+2c_5+2^2 c_8+2c_7+c_6 \quad (2B)$$

Equation (2B) can be expanded and realigned to yield Equation (2C) as follows:

$$\begin{aligned}N_{OUT} &= 2^7 c_0 + 2^6 c_1 + 2^5 c_2 + 2^4 c_3 + 2^3 c_4 + 2^2 c_5 + \\ &\quad 2^6 c_0 + 2^5 c_1 + 2^4 c_2 + 2^3 c_3 + 2^2 c_4 + 2c_5 + \\ &\quad 2^2 c_8 + 2c_7 + c_6 \\ &= 2^8 d_8 + 2^7 d_7 + 2^6 d_6 + 2^5 d_5 + 2^4 d_4 + 2^3 d_3 + 2^2 d_2 + \\ &\quad 2d_1 + d_0 \end{aligned} \quad (2C)$$

Using the alignment between the $c_i$ and $d_i$ terms in Equation (2C) provides the relationships of Equation (3) as follows:

$$d_0 = c_6 \quad (3)$$
$$d_1 = c_5 \oplus c_7 \qquad CR_1 = c_5 \cdot c_7$$
$$d_2 = c_4 \oplus c_5 \oplus c_8 \oplus CR_1 \qquad CR_2 = CR_1 \cdot c_4 + CR_1 \cdot c_5 + CR_1 \cdot c_8 + c_4 \cdot c_5 + c_4 \cdot c_8 + c_5 \cdot c_8$$
$$d_3 = c_3 \oplus c_4 \oplus CR_2 \qquad CR_3 = CR_2 \cdot c_3 + CR_2 \cdot c_4 + c_3 \cdot c_4$$
$$d_4 = c_2 \oplus c_3 \oplus CR_3 \qquad CR_4 = CR_3 \cdot c_2 + CR_3 \cdot c_3 + c_2 \cdot c_3$$
$$d_5 = c_1 \oplus c_2 \oplus CR_4 \qquad CR_5 = CR_4 \cdot c_1 + CR_4 \cdot c_2 + c_1 \cdot c_2$$
$$d_6 = c_0 \oplus c_1 \oplus CR_5 \qquad CR_6 = CR_5 \cdot c_0 + CR_5 \cdot c_1 + c_0 \cdot c_1$$
$$d_7 = c_0 \oplus CR_6$$
$$d_8 = c_0 \cdot CR_6$$

where "$\oplus$" represents the logical "XOR" (i.e., exclusive OR) function, "·" represents the logical "AND" function, and "+" represents the logical "OR" function. Note that because $N_{IN}$ is never greater than 383, when $c_8$ is 1, $c_7$=0. This fact can be exploited to simplify the hardware implementation of the present invention by recognizing that, if $c_8$=1, then $CR_1 32\ 0$ and $CR_{1 \cdot c_8}$=0 and, if $c_8$=0, then $CR_1 \cdot c_8$= 0. Thus, the expression for $CR_2$ in Equation (3) can be simplified as Equation (4) as follows:

$$CR_2=CR_1 \cdot c_4+CR_1 \cdot c_5+c_4 \cdot c_5+c_4 \cdot c_8+c_5 \cdot c_8. \quad (4)$$

Substituting the expression for $CR_1$ in Equation (3) into the expression for $CR_2$ in Equation (4) and simplifying yields Equation (5) as follows:

$$CR_2=CR_1 \cdot c_4+c_5 \cdot c_7 \cdot c_5+c_4 \cdot c_5+c_4 \cdot c_8+c_5 \cdot c_8. \quad (5)$$

Since $c_5 \cdot c_7 \cdot c_5=c_5 \cdot c_7=CR_1$, Equation (5) can be rewritten as Equation (6) as follows:

$$CR_2 = CR_1 \cdot c_4 + CR_1 + c_4 \cdot c_5 + c_4 \cdot c_8 + c_5 \cdot c_8. \quad (6)$$

Extracting the common $CR_1$ term in Equation (6) yields Equation (7) as follows:

$$CR_2 = CR_1 \cdot (c_4 + 1) + c_4 \cdot c_5 + c_4 \cdot c_8 + c_5 \cdot c_8. \quad (7)$$

Since $(c_4+1)=1$, Equation (7) can be rewritten as Equation (8) as follows:

$$CR_2 = CR_1 + c_4 \cdot c_5 + c_4 \cdot c_8 + c_5 \cdot c_8. \quad (8)$$

Equation (2) is a closed-form expression corresponding to the interleaving process applied by a base station to the un-interleaved symbol stream of the forward-link Paging and Traffic channels in a cdmaOne telecommunication system. These closed-form expressions can be implemented in either hardware or software or even a combination of hardware and software.

Hardware Implementation

In one possible hardware implementation of the present invention, a forward-link interleaver in the base station of a cdmaOne telecommunication system comprises an address generation unit and a symbol buffer. The symbol buffer contains a maximum of 384 symbols corresponding to a frame in the forward-link data stream. Each un-interleaved symbol is synchronized by a symbol clock obtained from the tracker section of the Rake receiver. Each symbol is written into the symbol buffer at the address indicated by the output of the address generation unit (i.e., $N_{OUT}$).

FIG. 2 shows a block diagram of an address generation unit 200 for a cdmaOne forward-link interleaver, according to one possible hardware embodiment of the present invention. Address generation unit 200 receives a clock signal corresponding to the un-interleaved symbol position $N_{IN}$ for the current symbol in the current frame of the un-interleaved data stream and generates the appropriate corresponding interleaved symbol position $N_{OUT}$ for the specific data stream (i.e., either a Paging channel or a Traffic channel), which is used as the address for writing the symbol to the symbol buffer.

In particular, address generation unit 200 has a modulo-384 counter 202. The symbol clock 210 is synchronized with the start-of-frame signal 212, with the counter being reset to zero at the start of each frame. The three MSBs of the 9-bit output of modulo-384 counter 202 are treated as a 3-bit input to adder 216, while the six LSBs of the 9-bit output of modulo-384 counter 202 are input to bit reversal unit 206, whose 6-bit output feeds multiply-by-6 block 214. Bit reversal unit 206 reverses the order of the six received bits, such that $(e_5, e_4, e_3, e_2, e_1, e_0) = (c_0, c_1, c_2, c_3, c_4, c_5)$. The 8-bit output from multiply-by-6 block 214 is the second input to adder 216. The output from adder 216, which is stored in register 208 is a 9-bit address equal to the interleaved symbol position $N_{OUT}$ of Equation (2).

Although counter 202 is shown in FIG. 2 as being reset at the start of each frame, in general, the counter need only be reset at the start of the first frame and again at any other event that may require synchronization.

Although counter 202 is shown in FIG. 2 as a modulo-384 counter, since the start-of-frame signal is used as a reset signal for counter 202, counter 202 could be implemented as a "modulo-385" or higher counter instead of a modulo-384 counter. In general, the term "modulo-384 counter" as used in this specification may be interpreted as referring to any modulo-384 or higher counter, with the 9 LSBs of the counter output used to generate the address.

As described, address generation unit 200 of FIG. 2 can be used to generate symbol buffer addresses to write decoded data into buffer locations corresponding to the interleaved sequence shown in FIG. 1B. In that case, after the buffer is filled, the interleaved data can be read sequentially from the memory for subsequent processing. This is an example of what is referred to as write-interleave-read-linear processing. Those skilled in the art will understand that address generation unit 200 of FIG. 2 can also be used to perform write-linear-read-interleave processing, in which the un-interleaved data is written linearly into a symbol buffer and then read from the buffer using the buffer addresses generated by address generation unit 200 to yield the interleaved symbol stream for subsequent processing.

Figure 3:
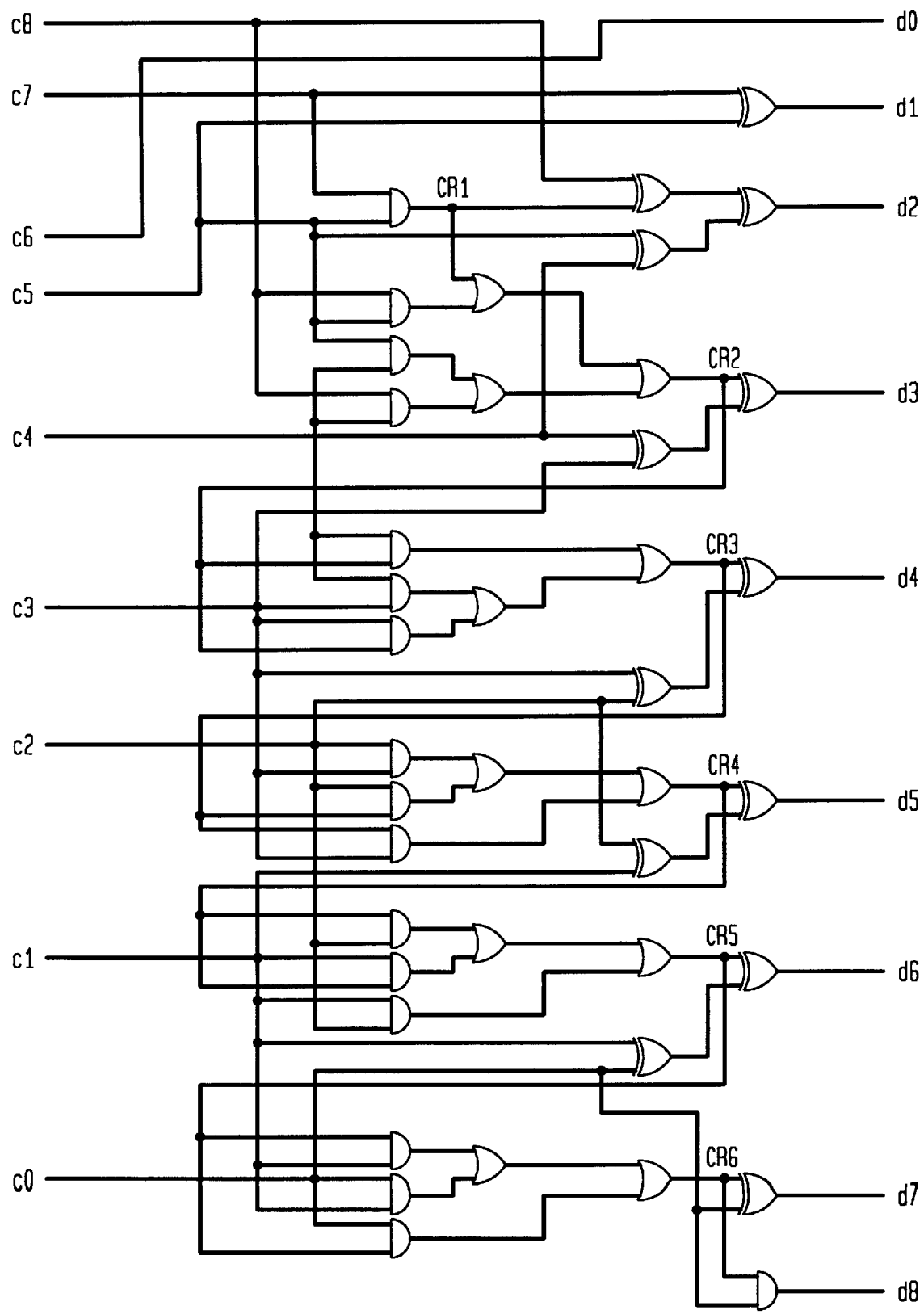
FIG. 3 shows a schematic diagram of a ripple carry adder hardware implementation of the address generation unit of FIG. 2.

Although the present invention has been described in the context of one possible hardware implementation, it will be understood that other alternative hardware implementations corresponding to the closed-form expression of Equation (2) are also possible. For example, the relationships of Equation (3) may be implemented as a ripple carry adder in integrated circuitry in a fairly straightforward manner using XOR, AND, and OR gates, such as that shown in FIG. 3. The circuit in FIG. 3 corresponds to one possible implementation of the configuration of bit reversal unit 206, multiply-by-6 block 214, and adder 216 of FIG. 2. Note that, even though $CR_4$ is a sum of four bits, the sum never exceeds 3, because $c_7$ and $c_8$ are both never equal to 1. Carry-look-ahead structures can also be used for faster operation of the circuit. Moreover, hardware embodiments can be implemented as part of an integrated circuit that also performs other base-station functions. In addition, the expressions can be implemented in software or in a combination of hardware and software, as appropriate. Even if implemented entirely in software, embodiments corresponding to the closed-form expression of Equation (2) are simpler than the table-based algorithms of existing systems.

Although the present invention has been explained in the context of cdmaOne communication systems, it will be understood that the present invention can also be implemented in the context of communication systems conforming to standards other than the cdmaOne family of communication standards.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method for interleaving a forward-link paging or traffic channel of a communication system, comprising the steps of:

(a) receiving an un-interleaved symbol stream for the forward-link channel;

(b) implementing a closed-form expression relating each un-interleaved symbol position to a corresponding interleaved symbol position to generate an interleaved symbol position for each symbol in the un-interleaved symbol stream, wherein the closed-form expression corresponds to two or more different sets of mathematical operations being applied to bits in a binary value representing each un-interleaved symbol position to generate bits in a binary value representing a corresponding interleaved symbol position; and (c) generating an interleaved symbol stream from the un-interleaved symbol stream using the interleaved symbol positions.

2. The method of claim 1, wherein:

the closed-form expression is given by:

$$N_{OUT}=6\times(2^5c_0+2^4c_1+2^3c_2+2^2c_3+2^1c_4+c_5)+2^2c_8+2c_7+c_6$$

wherein:

$N_{OUT}$ is the interleaved symbol position; and the un-interleaved symbol position is represented by the 9-tuple ($c_8$, $c_7$, $c_6$, $c_5$, $c_4$, $c_3$, $c_2$, $c_1$, $c_0$).

3. The method of claim 2, wherein the closed-form expression is implemented in software.

4. The method of claim 2, wherein the closed-form expression is implemented in hardware.

5. The method of claim 4, wherein the closed-form expression is implemented in a single integrated circuit.

6. The method of claim 5, wherein the hardware implementation comprises:

(1) a modulo-384 or higher counter adapted to generate the 9-tuple ($c_8$, $c_7$, $c_6$, $c_5$, $c_4$, $c_3$, $c_2$, $c_1$, $c_0$) from the un-interleaved symbol position;

(2) a bit reversal unit adapted to generate the 6-tuple ($e_5$, $e_4$, $e_3$, $e_2$, $e_1$, $e_0$) from the 6-tuple ($c_5$, $c_4$, $c_3$, $c_2$, $c_1$, $c_0$) by reversing the order of the bits;

(3) a multiply-by-6 block adapted to multiply the value corresponding to the 6-tuple ($e_5$, $e_4$, $e_3$, $e_2$, $e_1$, $e_0$) by 6; and (4) an adder to add the value corresponding to the 3-tuple ($c_8$, $c_7$, $c_6$) and the value generated by the multiply-by-6 block to generate the interleaved symbol position.

7. The method of claim 5, wherein the closed-form expression is implemented using a circuit of logic devices corresponding to the following relationships:

$$d_0 = c_6$$
$$d_1 = c_5 \oplus c_7 \qquad CR_1 = c_5 \cdot c_7$$
$$d_2 = c_4 \oplus c_5 \oplus c_8 \oplus CR_1 \qquad CR_2 = CR_1 + c_4 \cdot c_5 + c_4 \cdot c_8 + c_5 \cdot c_8$$
$$d_3 = c_3 \oplus c_4 \oplus CR_2 \qquad CR_3 = CR_2 \cdot c_3 + CR_2 \cdot c_4 + c_3 \cdot c_4$$
$$d_4 = c_2 \oplus c_3 \oplus CR_3 \qquad CR_4 = CR_3 \cdot c_2 + CR_3 \cdot c_3 + c_2 \cdot c_3$$
$$d_5 = c_1 \oplus c_2 \oplus CR_4 \qquad CR_5 = CR_4 \cdot c_1 + CR_4 \cdot c_2 + c_1 \cdot c_2$$
$$d_6 = c_0 \oplus c_1 \oplus CR_5 \qquad CR_6 = CR_5 \cdot c_0 + CR_5 \cdot c_1 + c_0 \cdot c_1$$
$$d_7 = c_0 \oplus CR_6$$
$$d_8 = c_0 \cdot CR_6$$

where "$\oplus$" represents the logical "XOR" function, "$\cdot$" represents the logical "AND" function, and "+" represents the logical "OR" function.

8. An interleaver for interleaving a forward-link paging or traffic channel of a communication system, comprising:

(a) means for receiving an un-interleaved symbol stream for the forward-link channel;

(b) means for implementing a closed-form expression relating each un-interleaved symbol position to a corresponding interleaved symbol position to generate an interleaved symbol position for each symbol in the un-interleaved symbol stream, wherein the closed-form expression corresponds to two or more different sets of mathematical operations being applied to bits in a binary value representing each un-interleaved symbol position to generate bits in a binary value representing a corresponding interleaved symbol position; and (c) means for generating an interleaved symbol stream from the un-interleaved symbol stream using the interleaved symbol positions.

9. The interleaver of claim 8, wherein:

the closed-form expression is given by:

$$N_{OUT}=6\times(2^5c_0+2^4c_1+2^3c_2+2^2c_3+2^1c_4+c_5)+2^2c_8+2c_7+c_6$$

wherein:

$N_{OUT}$ is the interleaved symbol position; and the un-interleaved symbol position is represented by the 9-tuple ($c_8$, $c_7$, $c_6$, $c_5$, $c_4$, $c_3$, $c_2$, $c_1$, $c_0$).

10. The interleaver of claim 9, wherein the closed-form expression is implemented in software.

11. The interleaver of claim 9, wherein the closed-form expression is implemented in hardware.

12. The interleaver of claim 11, wherein the closed-form expression is implemented in a single integrated circuit.

13. The interleaver of claim 12, wherein the hardware implementation comprises:

(1) a modulo-384 or higher counter adapted to generate the 9-tuple ($c_8$, $c_7$, $c_6$, $c_5$, $c_4$, $c_3$, $c_2$, $c_1$, $c_0$) from the un-interleaved symbol position;

(2) a bit reversal unit adapted to generate the 6-tuple ($e_5$, $e_4$, $e_3$, $e_2$, $e_1$, $e_0$) from the 6-tuple ($c_5$, $c_4$, $c_3$, $c_2$, $c_1$, $c_0$) by reversing the order of the bits;

(3) a multiply-by-6block adapted to multiply the value corresponding to the 6-tuple ($e_5$, $e_4$, $e_3$, $e_2$, $e_1$, $e_0$) by 6; and (4) an adder to add the value corresponding to the 3-tuple ($c_8$, $c_7$, $c_6$) and the value generated by the multiply-by-6 block to generate the interleaved symbol position.

14. The interleaver of claim 12, wherein the closed-form expression is implemented using a circuit of logic devices corresponding to the following relationships:

$$d_0 = c_6$$
$$d_1 = c_5 \oplus c_7 \qquad CR_1 = c_5 \cdot c_7$$
$$d_2 = c_4 \oplus c_5 \oplus c_8 \oplus CR_1 \qquad CR_2 = CR_1 + c_4 \cdot c_5 + c_4 \cdot c_8 + c_5 \cdot c_8$$
$$d_3 = c_3 \oplus c_4 \oplus CR_2 \qquad CR_3 = CR_2 \cdot c_3 + CR_2 \cdot c_4 + c_3 \cdot c_4$$
$$d_4 = c_2 \oplus c_3 \oplus CR_3 \qquad CR_4 = CR_3 \cdot c_2 + CR_3 \cdot c_3 + c_2 \cdot c_3$$
$$d_5 = c_1 \oplus c_2 \oplus CR_4 \qquad CR_5 = CR_4 \cdot c_1 + CR_4 \cdot c_2 + c_1 \cdot c_2$$
$$d_6 = c_0 \oplus c_1 \oplus CR_5 \qquad CR_6 = CR_5 \cdot c_0 + CR_5 \cdot c_1 + c_0 \cdot c_1$$
$$d_7 = c_0 \oplus CR_6$$
$$d_8 = c_0 \cdot CR_6$$

where "$\oplus$" represents the logical "XOR" function, "$\cdot$" represents the logical "AND" function, and "+" represents the logical "OR" function.

15. An integrated circuit having an interleaver for interleaving a forward-link paging or traffic channel of a communication system, wherein the interleaver comprises:

(A) a symbol buffer; and
(B) an address generation unit adapted to generate symbol addresses for reading un-interleaved symbols from or writing interleaved symbols to the symbol buffer, wherein the address generation unit implements a closed-form expression relating each un-interleaved symbol position to a corresponding interleaved symbol position to generate an interleaved symbol position for each symbol in the un-interleaved symbol stream, wherein the closed-form expression corresponds to two or more different sets of mathematical operations being applied to bits in a binary value representing each un-interleaved symbol position to generate bits in a binary value representing a corresponding interleaved symbol position.

16. The integrated circuit of claim 15, wherein:
the closed-form expression is given by:

$$N_{OUT}=6\times(2^5c_0+2^4c_1+2^3c_2+2^2c_3+2^1c_4+c_5)+2^2c_8+2c_7+c_6$$

wherein:
$N_{OUT}$ is the interleaved symbol position; and
the un-interleaved symbol position is represented by the 9-tuple ($c_8$, $c_7$, $c_6$, $c_5$, $c_4$, $c_3$, $c_2$, $c_1$, $c_0$).

17. The integrated circuit of claim 16, wherein the address generation unit comprises:
(1) a modulo-384 or higher counter adapted to generate the 9-tuple ($c_8$, $c_7$, $c_6$, $c_5$, $c_4$, $c_3$, $c_2$, $c_1$, $c_0$) from the un-interleaved symbol position;
(2) a bit reversal unit adapted to generate the 6-tuple ($e_5$, $e_4$, $e_3$, $e_2$, $e_1$, $e_0$) from the 6-tuple ($c_5$, $c_4$, $c_3$, $c_2$, $c_1$, $c_0$) by reversing the order of the bits;
(3) a multiply-by-6 block adapted to multiply the value corresponding to the 6-tuple ($e_5$, $e_4$, $e_3$, $e_2$, $e_1$, $e_0$) by 6; and
(4) an adder to add the value corresponding to the 3-tuple ($c_8$, $c_7$, $C_6$) and the value generated by the multiply-by-6 block to generate the interleaved symbol position.

18. The integrated circuit of claim 16, wherein the closed-form expression is implemented using a circuit of logic devices corresponding to the following relationships:

$$d_0 = c_6$$

$$d_1 = c_5 \oplus c_7 \qquad CR_1 = c_5 \cdot c_7$$

$$d_2 = c_4 \oplus c_5 \oplus c_8 \oplus CR_1 \qquad CR_2 = CR_1 + c_4 \cdot c_5 + c_4 \cdot c_8 + c_5 \cdot c_8$$

$$d_3 = c_3 \oplus c_4 \oplus CR_2 \qquad CR_3 = CR_2 \cdot c_3 + CR_2 \cdot c_4 + c_3 \cdot c_4$$

$$d_4 = c_2 \oplus c_3 \oplus CR_3 \qquad CR_4 = CR_3 \cdot c_2 + CR_3 \cdot c_3 + c_2 \cdot c_3$$

$$d_5 = c_1 \oplus c_2 \oplus CR_4 \qquad CR_5 = CR_4 \cdot c_1 + CR_4 \cdot c_2 + c_1 \cdot c_2$$

$$d_6 = c_0 \oplus c_1 \oplus CR_5 \qquad CR_6 = CR_5 \cdot c_0 + CR_5 \cdot c_1 + c_0 \cdot c_1$$

$$d_7 = c_0 \oplus CR_6$$

$$d_8 = c_0 \cdot CR_6$$

where "$\oplus$" represents the logical "XOR" function, "$\cdot$" represents the logical "AND" function, and "+" represents the logical "OR" function.

19. The method of claim 1, wherein the closed-form expression is implementable without relying on any lookup tables.

20. The interleaver of claim 8, wherein the closed-form expression is implementable without relying on any lookup tables.

21. The integrated circuit of claim 15, wherein the closed-form expression is implementable without relying on any lookup tables.

* * * * *